United States Patent
Wang et al.

(10) Patent No.: US 8,934,950 B2
(45) Date of Patent: Jan. 13, 2015

(54) SUPERCONDUCTING MAGNET SYSTEM FOR NUCLEAR MAGNETIC RESONANCE WITH HIGH MAGNETIC FIELD AND HIGH DEGREE OF HOMOGENEITY OF MAGNETIC FIELD

(75) Inventors: Qiuliang Wang, Beijing (CN); Yinming Dai, Beijing (CN); Baozhi Zhao, Beijing (CN); Xinning Hu, Beijing (CN); Luguang Yan, Beijing (CN); Housheng Wang, Beijing (CN); Shunzhong Chen, Beijing (CN)

(73) Assignee: Institute of Electrical Engineering, Chinese Academy of Sciences, Beijing (CN)

( * ) Notice: Subject to any disclaimer, the term of this patent is extended or adjusted under 35 U.S.C. 154(b) by 128 days.

(21) Appl. No.: 13/824,798

(22) PCT Filed: Mar. 3, 2011

(86) PCT No.: PCT/CN2011/000345
§ 371 (c)(1),
(2), (4) Date: Mar. 18, 2013

(87) PCT Pub. No.: WO2012/075663
PCT Pub. Date: Jun. 14, 2012

(65) Prior Publication Data
US 2013/0184158 A1    Jul. 18, 2013

(30) Foreign Application Priority Data
Dec. 8, 2010  (CN) .......................... 2010 1 0593131

(51) Int. Cl.
*G01R 33/035*    (2006.01)
*G01R 33/3815*   (2006.01)
*G01R 33/38*     (2006.01)
*G01R 33/3875*   (2006.01)
*G01R 33/421*    (2006.01)

(52) U.S. Cl.
CPC ........ *G01R 33/3815* (2013.01); *G01R 33/3802* (2013.01); *G01R 33/3875* (2013.01); *G01R 33/421* (2013.01)
USPC ......................................................... 505/162

(58) Field of Classification Search
CPC .............. H01L 39/225; H01L 39/2496; G01R 33/0358; G01R 33/0352
See application file for complete search history.

(56) References Cited

U.S. PATENT DOCUMENTS

| 5,237,300 A | 8/1993 | Ige et al. |
| 7,924,126 B2 * | 4/2011 | Hait et al. ..................... 335/216 |

(Continued)

FOREIGN PATENT DOCUMENTS

| CN | 101552077 A | 10/2009 |
| CN | 101728051 A | 6/2010 |

*Primary Examiner* — Colleen Dunn
(74) *Attorney, Agent, or Firm* — The Webb Law Firm

(57) ABSTRACT

A superconducting magnet system for nuclear magnetic resonance with a high magnetic field and a high degree of homogeneity of magnetic field is provided. The system comprises a main coil and a magnetic field homogeneity compensating coil having a combination of a forward current and a reverse current, and is composed of 24 superconducting coils formed by winding NbTi/Cu low-temperature superconducting wires. The system can produce a magnetic field of 9.4 T within a room-temperature space of 800 mm and can obtain a degree of non-homogeneity of magnetic field less than 0.1 ppm within a spherical volume of 300 mm. The system is equipped with a superconducting magnet inside, and a low-temperature vessel for liquid helium provides a low-temperature environment of 4K which is required for the normal operation of the superconducting magnet. A ferro-magnetic shielding system enables the system to have a good electromagnetic compatibility.

8 Claims, 5 Drawing Sheets

(56) References Cited

U.S. PATENT DOCUMENTS

| | | |
|---|---|---|
| 8,204,563 B2 | 6/2012 | Wang et al. |
| 8,570,127 B2 * | 10/2013 | Wang et al. ............ 335/216 |
| 8,653,920 B2 * | 2/2014 | Huang et al. ............ 335/216 |
| 2005/0134414 A1 | 6/2005 | Wakuda et al. |
| 2013/0033346 A1 | 2/2013 | Wang et al. |

* cited by examiner

SUPERCONDUCTING MAGNET SYSTEM FOR NUCLEAR MAGNETIC RESONANCE WITH HIGH MAGNETIC FIELD AND HIGH DEGREE OF HOMOGENEITY OF MAGNETIC FIELD

TECHNICAL FIELD

The present invention relates to a magnet system for a nuclear magnetic resonance imaging apparatus, and more particularly, relates to a superconducting magnet system with a high magnetic field and a high degree of homogeneity of magnetic field for a nuclear magnetic resonance imaging apparatus.

BACKGROUND ART

A magnetic resonance imaging (MRI) system is mainly comprised of a magnet system, a spectroscopy system, a computer system and an image displaying system. Wherein, the magnet system has a function of generating a magnetic field having a degree of non-homogeneity less than 1 ppm within a spherical volume of 500 mm. Currently, the nuclear magnetic resonance imaging system has a magnetic induction generally ranging from 0.35 tesla (T) to 3 T, and has been widely used in hospitals all around the world. However, the MRI system with a magnetic induction above 7 T primarily has applications in scientific researches. The MRI signal intensity has a decisive influence on the signal-to-noise ratio of an image, while the signal intensity is substantially in a square proportion to the magnetic field intensity. Thus, enhancing the magnetic field intensity has become the most important development goal for MRI technology.

With the development of superconducting magnet and cryogenic technology, advanced fabrication technique and massive numerical optimization technique have been applied to magnetic field analysis and fabrication of nuclear magnetic resonance magnet systems. By combing a super computer with a superconducting magnet system for nuclear magnetic resonance with a high magnetic field, visualization of the overall system can be achieved. The massive information obtained by nuclear magnetic resonance with a super-high magnetic field is processed rapidly by the super computer so as to achieve a rapid diagnosis of a molecular level, thereby achieving a modern diagnostic equipment that is indispensable in the clinical imaging diagnosis. Due to new functions brought in by the super-high magnetic field, the magnetic resonance imaging technology plays a more and more important role in the field of life detection, which can, by means of image, demonstrate the metabolic process of a human body, detect the mechanism of the nervous system, probe human diseases in very-early phase, or the like. With the rapid development of computer technology, currently, it is possible to reconstruct a four-dimensional magnetic resonance image of a super-high resolution by means of the ultra-high speed of computing capability of a computer, and to perform a multi-scale human body simulation. The combination of a super computer with a magnetic resonance imaging with a super-high magnetic field forms a so-called concept of super magnetic resonance imaging.

In the aspects of life research and clinical application, a higher sensitivity to blood flow signal and degree of oxygen utilization can be obtained, molecules of low concentration contents can be more accurately detected, and an environment in which molecules "inhabit and gather" can be precisely positioned in high-field craniocerebral MRI. MRI of a super-high magnetic field intensity can obtain a higher resolution. With the development of higher magnetic field MRI and a better array or superconducting coil, a resolution of a level of 1 mm that is currently and frequently used in clinic can be advanced to 300 μm, or even 100 μm, such that a better contrast and richer image information can be obtained. Under a high resolution and a super-high magnetic field, more colorful fine structures can be observed, in addition to original dispersion, perfusion, functions or the like. The increase of the amount of information will exceed the pure increase of resolution, which may become unaffordable for imaging experts. Thus, how to more automatically handle and integrate such massive information so as to assist a more rapid and accurate diagnosis as well as an early predication has become more and more important.

The superconducting magnet with a high degree of homogeneity has a high magnetic field stability, so that it can be adapted to user's needs and provide various magnetic field configurations and spatial distribution characteristics of magnetic field. For example, a combination of a plurality of coaxial solenoids can achieve an asymmetric magnet of a high degree of homogeneity, forming a superconducting magnetic resonance imaging system with two or more homogeneous regions of high magnetic fields and high degrees of homogeneity. Currently, the nuclear magnetic resonance magnet developed and applied at home and abroad has a magnetic induction from 1.5 T to 3 T. As for the nuclear magnetic resonance magnet system with a high magnetic field and a high degree of homogeneity, it is still under study and development.

SUMMARY OF THE INVENTION

The present invention aims at overcoming the defects of the existing superconducting magnet with a low magnetic field, and proposes a superconducting magnet system with a high magnetic field and a high degree of homogeneity of magnetic field. The superconducting magnet system according to the present invention is compact in structure, has a low operating cost, and is easy for fabrication.

The superconducting magnet system according to the present invention comprises a main coil, a low-temperature vessel, a room-temperature space, liquid helium, a lifting rod, a first refrigerator, a liquid helium condensing refrigerator, a quench blast valve, a second refrigerator, an external vacuum vessel, a 80 Kelvin (K) radiation shielding screen, a 40K radiation shielding screen, an annular girder supporting structure, a lifting wheel, an aspirating hole, a bottom saddle support, an axial restricting draw rod, a heat radiation shielding screen, a magnetic field homogeneity compensating coil and a liquid helium condenser.

The main coil and the magnetic field homogeneity compensating coil constitute a superconducting magnet, and are both formed by winding NbTi/Cu superconducting wires. The magnetic field homogeneity compensating coil is formed by coaxially winding around the outer surface of the main coil. The superconducting magnet is lifted inside the low-temperature vessel by the lifting rod. The low-temperature vessel is used to store liquid helium to achieve a low temperature required by the operation of the superconducting magnet. The low-temperature vessel has a room-temperature space. Around the outer surface of the low-temperature vessel, the 40K radiation shielding screen is placed. Around the outer surface of 40K radiation shielding screen, the 80K radiation shielding screen is placed. The outer surface of the 80K radiation shielding screen is connected to the external vacuum vessel by means of a draw rod. On the external vacuum vessel, the first refrigerator, the liquid helium condensing refrigerator, the quench blast valve, and the second refrigerator are mounted. Wherein, the first refrigerator is connected with the 40K radiation shielding screen, the second refrigerator is connected with the 80K radiation shielding screen, and the liquid helium condensing refrigerator is connected with the low-temperature vessel and the liquid helium condenser inside the low-temperature vessel. The external vacuum vessel is stably supported by means of the annular girder supporting structure and the bottom saddle support. The outer surface of the connection portion between the low-temperature vessel and the external vacuum vessel is wrapped with the heat radiation shielding screen. At the bottom of the outer surface of the external vacuum vessel, there is the aspirating hole for obtaining vacuum. The superconducting magnet is axially positioned by the axial restricting draw rod and is radially positioned by the lifting wheel.

The main coil is used for generating a central magnetic field and the compensating coil is used for compensating the homogeneity of the magnetic field. The main coil is comprised of a first set of coils, a second set of coils, a third set of coils, a fourth set of coils and a fifth set of coils that are coaxially arranged from inside to outside. The main coil has eight grades of coil diameters that decrease gradually from inside to outside along the radial direction. The magnetic field homogeneity compensating coil is comprised of: two end compensating coils located at the two ends of the outer surface of the fifth set of coils and arranged symmetrically and coaxially with the main coil, and three middle compensating coils located at the middle of the outer surface of the fifth set of coils and arranged coaxially with the main coil, wherein the two end compensating coils are supplied with a forward current for producing required magnetic field compensation, and the three middle compensating coils are supplied with a reverse current for compensating higher harmonic parameters so as to enhance the degree of homogeneity of the superconducting magnet. After the compensation, a degree of non-homogeneity of magnetic field less than 0.1 ppm within a range of 300 mm can be realized. The superconducting magnet has a length of 3100 mm, the ratio of the maximum magnetic field $B_m$ to the central magnetic field $B_0$ of the superconducting magnet is 1.0185, and the ratio of the operating current of each coil to the critical current under which the local magnetic field causes quench is less than 90%.

In one particular embodiment of the present invention, the superconducting coil employs 6061-T6 high strength aluminum alloy as the fabrication material for its skeleton, so as to provide a structural support for the system and accelerate the quench propagation velocity of the coil, thereby ensuring that energy after coil quenching can be uniformly released within the superconducting coil so as to reduce the average temperature rise of the system and guarantee the safety of the magnet.

The inner-most set of coils, the second set of coils, the third set of coils, the fourth set of coils and the fifth set of coils of the main coil of the superconducting magnet of the present invention are coaxially assembled together from inside to outside using an overall vacuum impregnation technology, with a clearance accuracy between these sets of coils within ±0.5 mm, thereby ensuring that the coil has a better overall rigidity.

In the case that the superconducting magnet of the present invention does not have a shield, the 5 Gauss (G) line is 17 m in the radial direction and 22 m in the axial direction.

According to the present invention, in the exterior region that is 6 m distant from the center of the superconducting magnet, a ferro-magnetic shielding system made from a soft iron material with an interior of a circular structure is provided for shielding the magnetic field of the superconducting magnet. The 5 G line of the magnetic field after shielding is 4 m in the radial direction and 7 m in the axial direction so as to ensure that the exterior stray magnetic field is not too large, such that the whole superconducting magnet has a good electromagnetic compatibility. The ferro-magnetic shielding system of the present invention has a thickness of 600 mm, with its inner wall 6 m distant from the center of the superconducting magnet.

The present invention employs three refrigerators to provide cold sources for the superconducting magnet. The low-temperature system has 20K and 80K cold shields for providing a low-temperature environment for the liquid helium vessel, and uses a 4K refrigerator to provide low-temperature condensing of the system. The low-temperature system operates under a negative pressure so as to reduce the temperature of the liquid helium and make the operating temperature reach 3K-3.8K. When the superconducting magnet is cooled down to a temperature of 4K, it is continuously cooled such that the pressure within the low-temperature vessel is further reduced, thereby making the superconducting magnet operate under a temperature of 3K-3.5K. After the operating current and the magnetic field of the superconducting magnet system meet preset requirements, the value of the pressure within the low-temperature vessel is adjusted and controlled to be kept constant.

The superconducting magnet system of the present invention can generate a magnetic flux intensity ranging from 9.4 T to 11.75 T, and is characterized in a large aperture, a high degree of homogeneity and passive shielding. It is applicable to scientific research instruments and equipments for magnetic resonance imaging with a super-high magnetic field as well as other MRI apparatus for high magnetic field imaging.

Below, the present invention will be further described with reference to the drawings in conjunction with the specific embodiments.

DETAILED DESCRIPTION OF THE PREFERRED MODES

A thorough description of the present invention will be presented below with reference to the drawings, in which the exemplary embodiments of the present invention are set forth.

Figure 1:
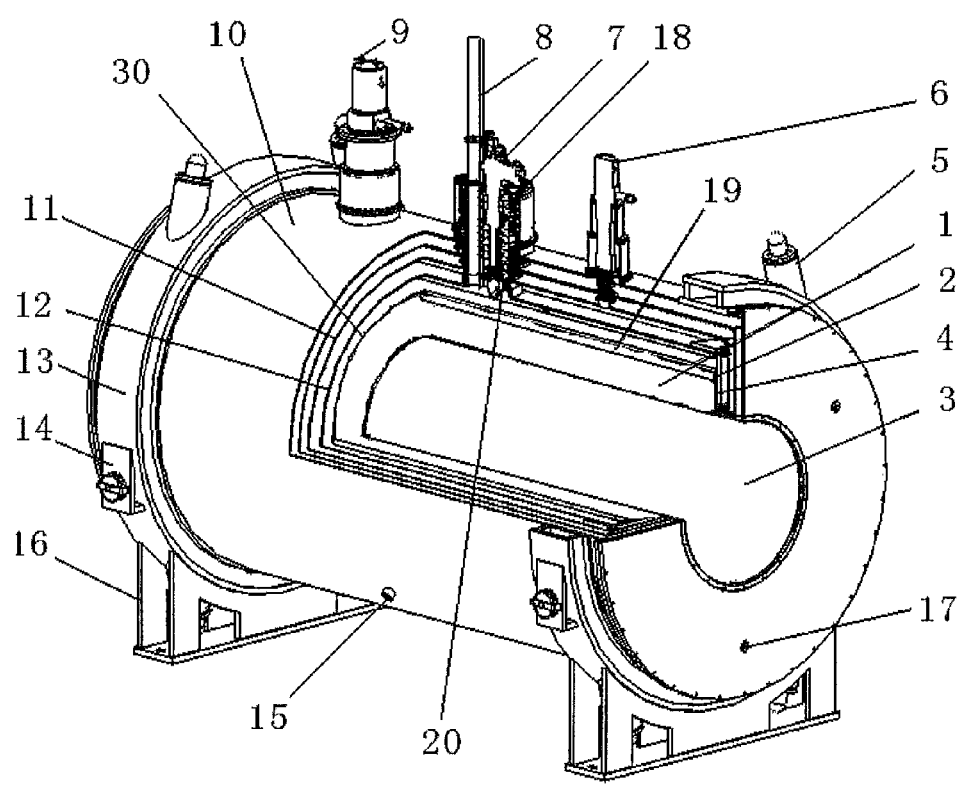
FIG. 1 is a structural view of the superconducting magnet system with a high magnetic field and a high degree of homogeneity of magnetic field according to an embodiment of the present invention, in which, 1 denotes a main coil, 2 denotes a low-temperature vessel, 3 denotes a room-temperature space, 4 denotes liquid helium, 5 denotes a lifting rod, 6 denotes a first refrigerator, 7 denotes a liquid helium condensing refrigerator, 8 denotes a quench blast valve, 9 denotes a second refrigerator, 10 denotes an external vacuum vessel, 11 denotes a 80K radiation shielding screen, 12 denotes a 40K radiation shielding screen, 13 denotes an annular girder supporting structure, 14 denotes a lifting wheel, 15 denotes an aspirating hole, 16 denotes a bottom saddle support, 17 denotes an axial restricting draw-rod, 18 denotes a heat radiation shielding screen, 19 denotes a magnetic field homogeneity compensating coil, 20 denotes a liquid helium condenser, and 30 denotes a superconducting magnet.

FIG. 1 shows the main structure and the spatial configuration of the superconducting magnet system according to the embodiments of the present invention. The superconducting magnet has a room-temperature aperture of 800 mm and a length of 3100 mm. The superconducting magnet 30 is comprised of a main coil 1 and a magnetic field homogeneity compensating coil 19 which are both formed by winding NbTi/Cu superconducting wires. The magnetic field homogeneity compensating coil 19 is formed by coaxially winding around the outer surface of the main coil 1. The main coil 1 is used for providing a main magnetic field of 9.4 T. The superconducting magnet has a weight of 25 tons, which is lifted inside a low-temperature vessel 2 by eight lifting rods 5. The low-temperature vessel 2 is used to store 1000 L liquid helium 4 and achieve a low temperature required by the operation of the superconducting magnet 30. The low-temperature vessel 2 has a room-temperature space 3. Around the outer surface of the low-temperature vessel 2, a 40K radiation shielding screen 12 is placed, and, around the outer surface of the 40K radiation shielding screen 12, a 80K radiation shielding screen 11 is placed. The outer surface of the 80K radiation shielding screen is connected to an external vacuum vessel 10 by means of a draw rod. On the surface of the external vacuum vessel 10, a first refrigerator 6, a liquid helium condensing refrigerator 7, a quenching blast valve 8, and a second refrigerator 9 are mounted. Wherein, the first refrigerator 6 is connected with the 40K radiation shielding screen, and the second refrigerator 9 is connected with the 80K radiation shielding screen. The liquid helium condensing refrigerator 7 is connected with the low-temperature vessel 2 and a liquid helium condenser 20 inside the low-temperature vessel 2. The external vacuum vessel 10 is stably supported by means of an annular girder supporting structure 13 and a bottom saddle support 16. The outer surface of the connection portion between the low-temperature vessel 2 and the external vacuum vessel 10 is wrapped with a heat radiation shielding screen 18. At the bottom of the outer surface of the external vacuum vessel 10, there is an aspirating hole 15 for obtaining vacuum. The superconducting magnet 30 is axially positioned by an axial restricting draw rod 17 and is radially positioned by a lifting wheel 14.

The liquid helium 4 is volatilized due to heat transmission through the connection between the low-temperature vessel 2 and the external vacuum vessel 10, and in order to ensure that the liquid helium 4 can self circulate within the low-temperature vessel 2, the liquid helium condensing refrigerator 7 provides a refrigerating output of 1.5 W, operates at 4K, and keeps liquid helium 4 changing from a gaseous state into a liquid state. The main coil 1 may quench during operation, and at this point, liquid helium 4 absorbs heat and then vaporizes such that its volume expands quickly within a short time. Thus, the quench blast valve 8 is needed for releasing pressure, wherein, the driving pressure of the quench blast valve 8 is 3.5 atm. The second refrigerator 9 further provides a refrigerating output of 620 W for cooling the 80K radiation shielding screen. The low-temperature vessel 2 is placed inside the external vacuum vessel 10 and its temperature is maintained by means of high vacuum. The 80K radiation shielding screen 11 and the 40K radiation shielding screen 12 are formed from aluminum alloy 1100. Since the weight of the main coil 1 and the low-temperature vessel 2 exceeds 40 tons, in order to enhance the lifting strength and guarantee the overall rigidity of the system, the stainless annular girder supporting structure 13 is adopted, and the gravity of the main coil 1 and the low-temperature vessel 2 as well as the 80K radiation shielding screen 11 and the 40K radiation shielding screen 12 is conveyed to the annular girder supporting structure 13 by the lifting rods 5. The lifting wheel 14 is provided in the horizontal direction in order to prevent the main coil 1 from moving laterally. The external vacuum vessel 10 is connected with an external vacuum pump through the aspirating hole 15 so as to obtain the required vacuum. The external vacuum vessel 10 inside which the low-temperature vessel 2 and the main coil 1 are contained is placed on the bottom saddle support 16 to obtain a stable support. The axial restricting draw rod 17 prevents the possible axial movement of the main coil 1 and obtains the axial positioning of the main coil 1, meanwhile ensures the structural stability of the main coil 1 during transportation. In order to reduce heat from the outside flowing into the low-temperature vessel 2, at the parts where the low-temperature vessel 2 is connected with the outside, multiple layers of the heat radiation shielding screen 18 are used for preventing radiative heat leakage. The magnetic field homogeneity compensating coil 19 is arranged coaxially with the outer layer of the main coil 1, for keeping the homogeneity of the magnetic field. Liquid helium 4 increases the cooled heat exchange area by the connection between the liquid helium condensing refrigerator 7 and the liquid helium condenser 20, thereby achieving liquid helium condensing. The overall heat leakage of the system is less than 1 W at a temperature of 4K. When the coil is cooled down to the temperature of 4K, the system is kept being cooled such that the pressure of the system is further reduced, and the coil operates at an operating temperature of 3K-3.5K. After charging and current modulating of the superconducting magnet system make the operating magnetic field and the current of the coil meet preset requirements, a heating control is mounted on the cryogenic cold head, which is in balance with the feedback control of the pressure value of liquid helium 4.

Figure 2:
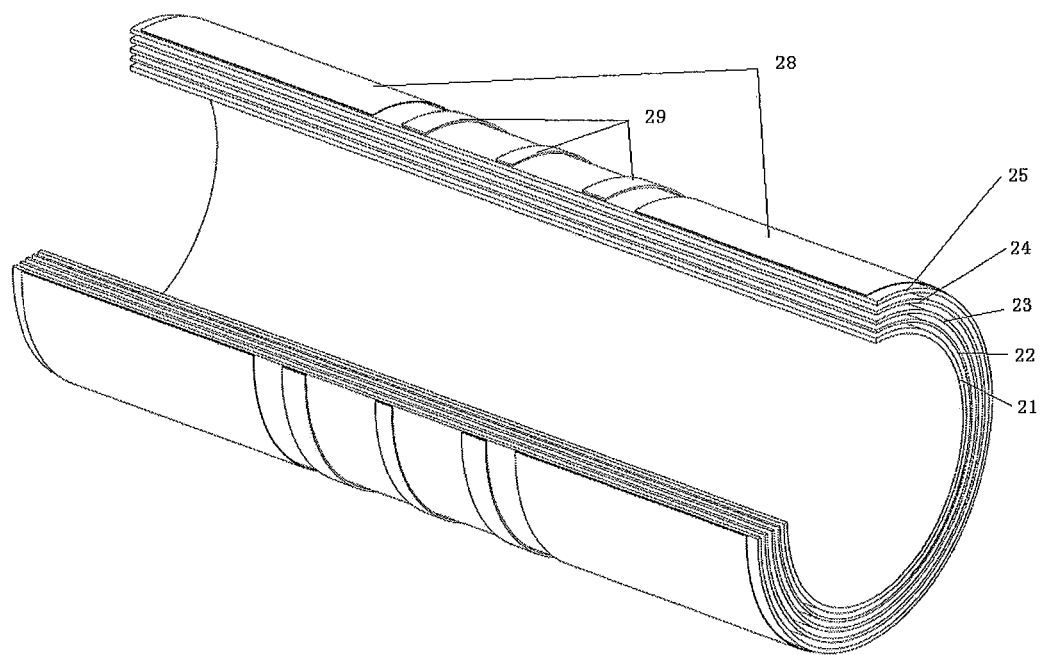
FIG. 2 is a specific structural view of the superconducting magnet according to an embodiment of the present invention, in which, 21 denotes an inner-most set of coils of the main coil, 22 denotes a second set of coils, 23 denotes a third set of coils, 24 denotes a fourth set of coils, 25 denotes a fifth set of coils, 28 denotes end compensating coils, and 29 denotes middle compensating coils.

As shown in FIG. 2, the main coil 1 is comprised of an inner-most set of coils 21, a second set of coils 22, a third set of coils 23, a fourth set of coils 24 and a fifth set of coils 25 that are coaxially arranged from inside to outside, and provides a central magnetic field of 9.4 T. The magnetic field homogeneity compensating coil 19 is comprised of an end compensating coil 28 and an middle compensating coil 29. The magnetic field homogeneity is corrected by the compensating coils.

The main coil 1 and the magnetic field homogeneity compensating coil 19 use NbTi/Cu superconducting wires of a rectangular structure. Wherein, the maximum diameter of the braided wires should be less than 1.5 mm and satisfies the maximum and minimum quench energy, and the ratio of the copper to the superconductor (Cu/SC) of the braided wires is less than 1.5. The inner-most set of coils 21 of the main coil contains two coils, using two kinds of rectangular conducting wires to wind around a aluminum alloy skeleton. In one particular embodiment of the present invention, 6061-T6 aluminum alloy is employed for fabricating the skeleton, so as to provide structural support for the coils. After the coils quenched, the current change produces eddy current heating within the 6061-T6 aluminum alloy skeleton, thereby achieving magnet passive trigger and releasing the heat uniformly so as to reduce the average temperature rise of the system and guarantee the safety of the superconducting magnet. The maximum magnetic field of the superconducting magnet can reach 9.588 T, the maximum inner radius of the main coil 1 is about 47.0 cm, the main coil 1 adopts NbTi/Cu superconducting wires having a relatively high transmission current, and the axial length of the main coil 1 is about 3.096 m. The ratio of the maximum magnetic field Bm to the central magnetic field $B_0$ of the superconducting magnet is 1.0185, and the ratio of the operating current of each coil to the critical current under which the local magnetic field causes quench is less than 90%. The magnetic field of the superconducting magnet gradually decreases from inside to outside in the radial direction. The second set of coils 22 contains 4 coaxially and tightly wound superconducting coils and formed by winding rectangular superconducting wires of four different sections. The second set of coils are of the same length as that of the inner-most set of coils 21 of the main coil and have a maximum magnetic field about 9.1 T. The third set of coils 23 contains 6 coaxially and tightly wound superconducting coils and formed by winding three kinds of rectangular conducting wires. The fourth set of coils 24 is comprised of 6 coaxially and tightly wound superconducting coils, using two kinds of superconducting wires. Wherein, the residual resistance ratio (RRR) value of the braided wires selected by the third set of coils 23 and the fourth set of coils 24 should be larger than 200, the RRR value of the stable base materials is around 80. The low-temperature tensile strength of the whole wires is larger than 250 MPa. The fifth set of coils 25 is comprised of one superconducting coil using one kind of superconducting wire. Each set of coils is supported by means of the aluminum alloy skeleton. After forming each set of coils by winding, these sets of coils are assembled coaxially. The clearance accuracy of the assembling of each set of coils reaches ±0.5 mm. The inner-most set of coils 21, the second set of coils 22, the third set of coils 23, the fourth set of coils 24 and the fifth set of coils 25 of the main coil that are coaxially arranged from inside to outside are assembled together using an overall vacuum impregnation technology, thereby ensuring that the coil has a better overall rigidity. The outer surface of the main coil 1 is comprised of the end compensating coil 28 that is supplied with a forward current and the middle compensating coil 29 that is supplied with a reverse current. The base materials selected by the superconducting wires are above 10 relative to the superconductor.

Figure 3:
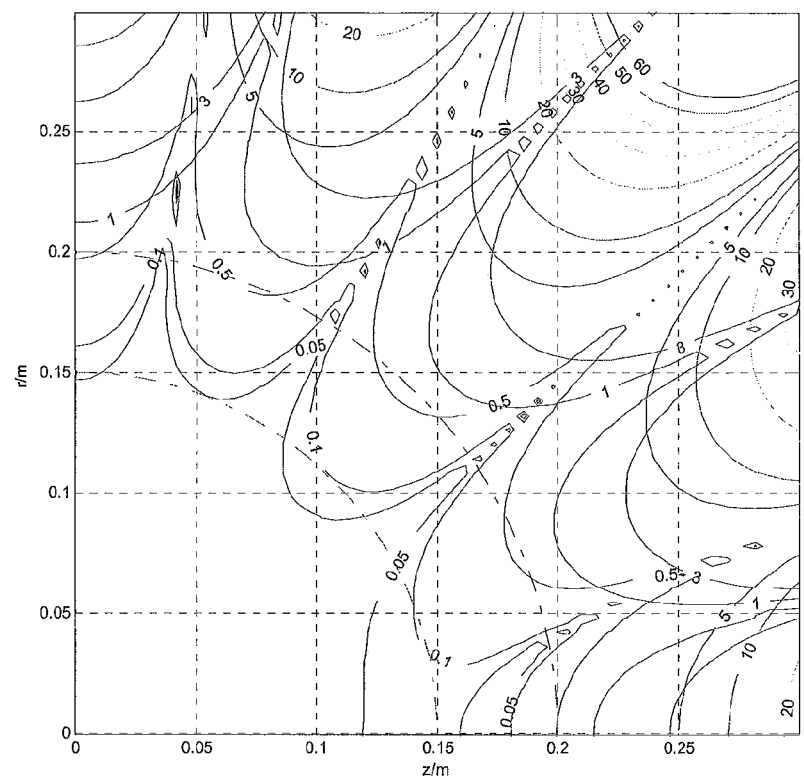
FIG. 3 is a pattern of equipotential lines of the homogeneity of the magnetic field having a magnetic induction of 9.4 T within the homogeneous region of the spherical volume according to an embodiment of the present invention.

FIG. 3 is a pattern of equipotential lines of the homogeneity of the magnetic field having a field intensity of 9.4 T within the homogeneous region of the spherical volume; the end compensating coil 28 and the middle compensating coil 29 provide magnetic field correction for the main coil 1, and the degree of non-homogeneity of the magnetic field is less than 0.1 ppm within a range of 300 mm.

Figure 4:
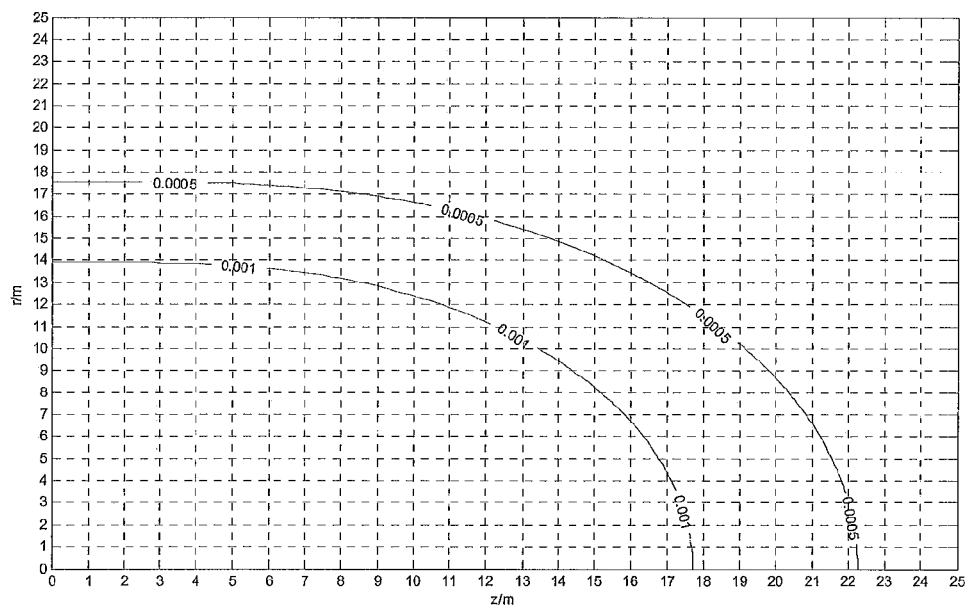
FIG. 4 is a profile of the magnetic field of the superconducting magnet that does not have a ferro-magnetic shield on the spatial 5 G line according to an embodiment of the present invention.

FIG. 4 provides the coil leakage magnetic field distribution, and the magnetic field distribution of the superconducting magnet that does not have a ferro-magnetic shielding system on the spatial 5 G line, which is less than 17 m in the radial direction and less than 22 m in the axial direction.

Figure 5:
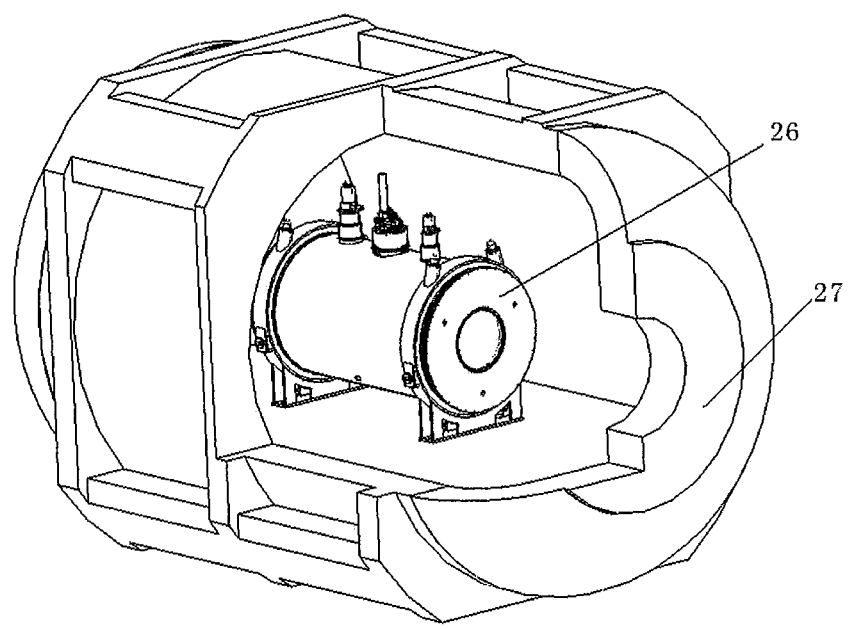
FIG. 5 is an overall structural view of the superconducting magnet and the ferro-magnetic shielding system as assembled together according to an embodiment of the present invention, in which, 26 denotes a superconducting magnet system and 27 denotes a ferro-magnetic shielding system of an outer iron yoke structure.

FIG. 5 is an overall arrangement view of the superconducting magnet and the ferro-magnetic shielding system. The superconducting magnet system 26 provides the field intensity and the degree of homogeneity of the magnetic field. In order to achieve that the superconducting magnet system has a better electromagnetic compatibility, a ferro-magnetic shielding system 27 having a thickness of 600 mm and a large-scale outer iron yoke structure is mounted outside the superconducting magnet system 26. The iron yoke is made from a soft iron material whose interior is in a circular shape, for shielding the interior magnetic field, meanwhile increasing the central magnetic field of the superconducting magnet by approximately $1/1000$.

Figure 6:
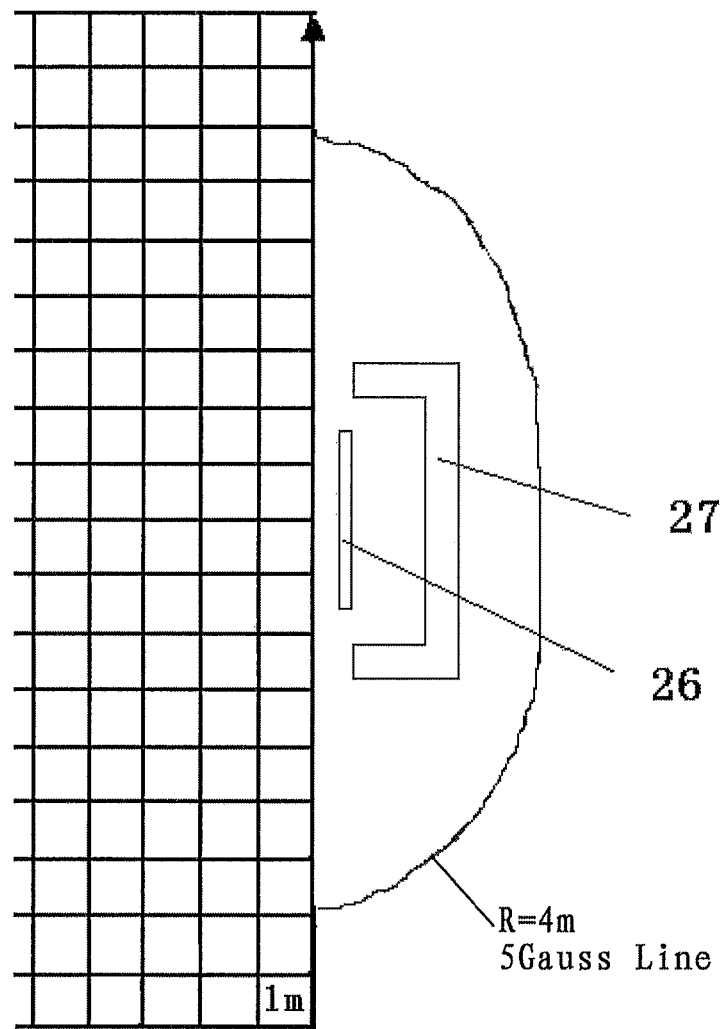
FIG. 6 is a profile of the 5 G line with the ferro-magnetic shielding system according to an embodiment of the present invention.

FIG. 6 is a profile of the superconducting magnet that has a ferro-magnetic shielding system on the spatial 5 G line, whose radius is less than 4 m in the radial direction and less than 7 m in the axial direction so as to ensure that the exterior stray magnetic field is not too large, such that the whole superconducting magnet has a good electromagnetic compatibility. The ferro-magnetic shielding system has a thickness of 600 mm, with its inner wall 6 m distant from the center of the superconducting magnet. Leakage magnetic field is effectively reduced, and the human body as well as instruments and equipments in the neighborhood can be prevented from being electromagnetically damaged to the most extent.

The description of the present invention is presented for illustration and explanation, but it is not exhaustive or to limit the present invention to the disclosed form. Numerous modifications and variations are apparent to one of ordinary skill in the art. The embodiments are selected and described in order to better explain the principle and application of the present invention and facilitate one of ordinary skill in the art understanding the present invention so as to conceive various other modified embodiments that are applicable to specific uses.

What is claimed is:

1. A superconducting magnet system for nuclear magnetic resonance with a high magnetic field and a high degree of homogeneity of magnetic field, said superconducting magnet system comprising: a main coil, a low-temperature vessel, a room-temperature space, liquid helium, a lifting rod, a first refrigerator, a liquid helium condensing refrigerator, a quench blast valve, a second refrigerator, an external vacuum vessel, a 80K radiation shielding screen, a 40K radiation shielding screen, an annular girder supporting structure, a lifting wheel, an aspirating hole, a bottom saddle support, an axial restricting draw rod, a heat radiation shielding screen, a magnetic field homogeneity compensating coil and a liquid helium condenser; said main coil and said magnetic field homogeneity compensating coil constitute a superconducting magnet, and are both formed by winding NbTi/Cu superconducting wires; said magnetic field homogeneity compensating coil is coaxially wound around the outer surface of said main coil; said superconducting magnet is lifted inside said low-temperature vessel by said lifting rod, liquid helium is stored by said low-temperature vessel; said low-temperature vessel has the room-temperature space; said 40K radiation shielding screen is placed around the outer surface of said low-temperature vessel, said 80K radiation shielding screen is placed around the outer surface of said 40K radiation shielding screen, the outer surface of said 80 k radiation shielding screen is connected to said external vacuum vessel by means of a draw rod; and said first refrigerator, said liquid helium condensing refrigerator, said quench blast valve, and said second refrigerator are mounted on said external vacuum vessel; wherein said first refrigerator is connected with said 40K radiation shielding screen, said second refrigerator is connected with said 80K radiation shielding screen, and said liquid helium condensing refrigerator is connected with said low-temperature vessel and said liquid helium condenser inside said low-temperature vessel; said external vacuum vessel is stably supported by means of said annular girder supporting structure and said bottom saddle support; the outer surface of the connection portion between said low-temperature vessel and said external vacuum vessel is wrapped with said heat radiation shielding screen; at the bottom of the outer surface of said external vacuum vessel, there is said aspirating hole; said superconducting magnet is axially positioned by said axial restricting draw rod and is radially positioned by said lifting wheel.

2. The superconducting magnet system for nuclear magnetic resonance with a high magnetic field and a high degree of homogeneity of magnetic field according to claim 1, wherein said main coil is comprised of an inner-most set of coils, a second set of coils, a third set of coils, a fourth set of coils and a fifth set of coils of said main coil that are coaxially arranged from inside to outside; said main coil has eight grades of coil diameters that decrease gradually from inside to outside along the radial direction.

3. The superconducting magnet system for nuclear magnetic resonance with a high magnetic field and a high degree of homogeneity of magnetic field according to claim 1, wherein said inner-most set of coils of the main coil is comprised of two coaxially and tightly wound coils and formed by winding rectangular superconducting wires of two different sectional sizes; said second set of coils is comprised of four coaxially and tightly wound coils and formed by winding rectangular superconducting wires of four different sectional sizes; said third set of coils is comprised of six coaxially and tightly wound coils and formed by winding rectangular superconducting wires of three different sectional sizes; said fourth set of coils is comprised of six coaxially and tightly wound coils and formed by winding rectangular superconducting wires of two different sectional sizes; said fifth set of coils is comprised of one coaxially and tightly wound coil and formed by winding a rectangular superconducting wire of one sectional size.

4. The superconducting magnet system for nuclear magnetic resonance with a high magnetic field and a high degree of homogeneity of magnetic field according to claim 1, wherein said magnetic field homogeneity compensating coil comprises: two end compensating coils located at the two ends of the outer surface of said fifth set of coils and arranged symmetrically and coaxially with said main coil, and three middle compensating coils located at the middle of the outer surface of said fifth set of coil and arranged coaxially with said main coil, wherein said two end compensating coils are supplied with a forward current for producing required magnetic field compensation, and said three middle compensating coils are supplied with a reverse current for compensating higher harmonic parameters so as to enhance the degree of homogeneity of said superconducting magnet.

5. The superconducting magnet system for nuclear magnetic resonance with a high magnetic field and a high degree of homogeneity of magnetic field according to claim 1, wherein said main coil of said superconducting magnet employs 6061-T6 high strength aluminum alloy material for its skeleton.

6. The superconducting magnet system for nuclear magnetic resonance with a high magnetic field and a high degree of homogeneity of magnetic field according to claim 1, wherein said main coil is formed by assembling an inner-most set of coils, a second set of coils, a third set of coils, a fourth set of coils and a fifth set of coils of the main coil that are coaxially arranged from inside to outside using an overall vacuum impregnation technology, with a clearance accuracy within ±0.5 mm.

7. The superconducting magnet system for nuclear magnetic resonance with a high magnetic field and a high degree of homogeneity of magnetic field according to claim 1, wherein a ferro-magnetic shielding system of an outer iron yoke structure made from a soft iron material is arranged in the exterior region of said superconducting magnet system.

8. The superconducting magnet system for nuclear magnetic resonance with a high magnetic field and a high degree of homogeneity of magnetic field according to claim 1, wherein when said superconducting magnet is cooled down to a temperature of 4K, it is continuously cooled such that the pressure within said low-temperature vessel is further reduced, thereby making said superconducting magnet operate under a temperature of 3K-3.5K; after the operating current and the magnetic field of said superconducting magnet system meet preset requirements, the pressure within said low-temperature vessel is controlled to be kept constant.

\* \* \* \* \*

UNITED STATES PATENT AND TRADEMARK OFFICE
CERTIFICATE OF CORRECTION

| | |
|---|---|
| PATENT NO. | : 8,934,950 B2 |
| APPLICATION NO. | : 13/824798 |
| DATED | : January 13, 2015 |
| INVENTOR(S) | : Wang et al. |

It is certified that error appears in the above-identified patent and that said Letters Patent is hereby corrected as shown below:

In the claim

Column 8, Line 60, Claim 1, delete "80 k" and insert -- 80K --

Signed and Sealed this
Fifth Day of May, 2015

Michelle K. Lee
*Director of the United States Patent and Trademark Office*